June 19, 1962 C. S. JONES ET AL 3,040,194

BISTABLE CIRCUIT UTILIZING PNPN DIODE IN SERIES WITH TRANSISTOR

Filed July 2, 1959 2 Sheets-Sheet 1

INVENTORS
Clarence S. Jones
Frank P. Lewandowski

BY

ATTORNEY

June 19, 1962 C. S. JONES ET AL 3,040,194

BISTABLE CIRCUIT UTILIZING PNPN DIODE IN SERIES WITH TRANSISTOR

Filed July 2, 1959 2 Sheets-Sheet 2

INVENTORS
Clarence S. Jones
Frank P. Lewandowski

BY Harvey J. Lewhurst [signature]

ATTORNEY

United States Patent Office 3,040,194
Patented June 19, 1962

3,040,194
BISTABLE CIRCUIT UTILIZING PNPN DIODE IN SERIES WITH TRANSISTOR

Clarence S. Jones, Los Altos, and Frank P. Lewandowski, Mountain View, Calif., assignors to General Precision, Inc., a corporation of Delaware Filed July 2, 1959, Ser. No. 824,591
18 Claims. (Cl. 307—88.5)

This invention relates to bistable circuits and, more particularly, to a set-reset flip-flop circuit.

A wide variety of electronic control and digital computer systems, such as for example, switches, counters and the individual stages of a digital buffer register, require bistable circuits which are put into one of their two stable states by the application of a "set" pulse to the set input lines and which are put into the other state by the application of a "reset" pulse to the reset input lines. Such bistable circuits are often referred to as R-S flip-flops (R-S standing for set-reset), toggle circuits, side-stable circuits, or latch circuits. Although conventional R-S flip-flops provide fairly satisfactory switching operation, their utilization is somewhat limited by the fact that their output impedance is high and that, therefore, only limited output power is available to drive, control or activate further circuits. Additionally, conventional R-S flip-flops usually require two electronic valves and a large number of additional components for proper operation, resulting in complex circuitry with its attendant decrease in reliability and increase in cost, and a bulky package not readily miniaturized. Often, a number of the components required for prior art R-S flip-flops are temperature sensitive, causing variation of operating conditions with change of temperature by introducing variations in the rise time and fall time of the output signal as the R-S flip-flop changes its state, or changes in the height or duration requirement for effecting a change of state. Also, prior art R-S flip-flops are not readily combined for parallel or joint operation so that a single electronic valve or control switch may be used in connection with a multi-staged register to effect its resetting.

It is therefore a primary object of the present invention to provide an R-S flip-flop whose output impedance is substantially smaller than that obtainable with conventional bistable circuits.

It is another object of this invention to provide an improved R-S flip-flop whose operation is substantially independent of variations in temperature.

It is still another object of this invention to provide an R-S flip-flop requiring a substantially fewer number of components than are required for conventional flip-flops and, therefore, being especially adaptable for miniaturization.

It is a further object of this invention to provide a simple R-S flip-flop which utilizes a single electrically actuated current valve.

It is a still further object of this invention to provide a buffer register including a plurality of the R-S flip-flops in accordance with the teachings of this invention which share a single current valve.

It is also an object of this invention to provide an improved R-S flip-flop which is less complex, smaller in size, less temperature sensitive and more reliable than conventional R-S flip-flops.

Other objects and many of the attendant advantages of this invention will be readily appreciated as they become better understood by reference to the following detailed description when considered in connection with the accompanying drawings wherein.

Figure 5A:
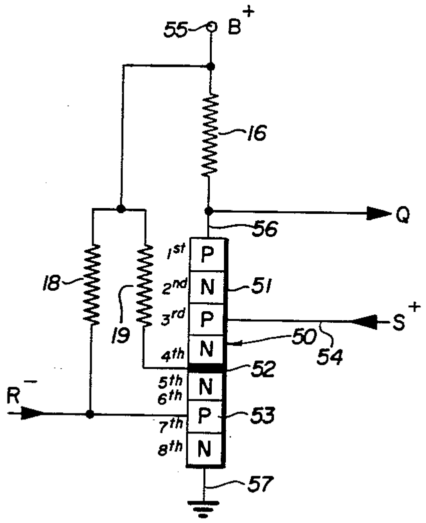
Figure 5B:
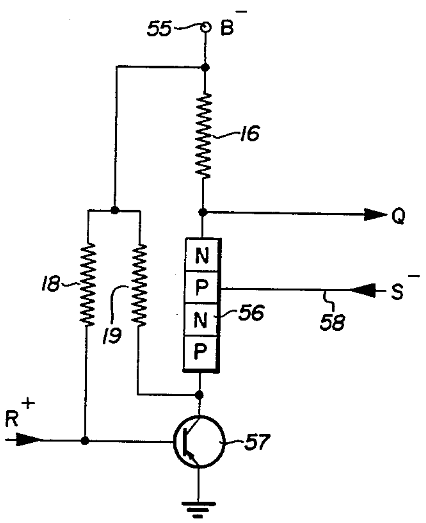
Figure 6:
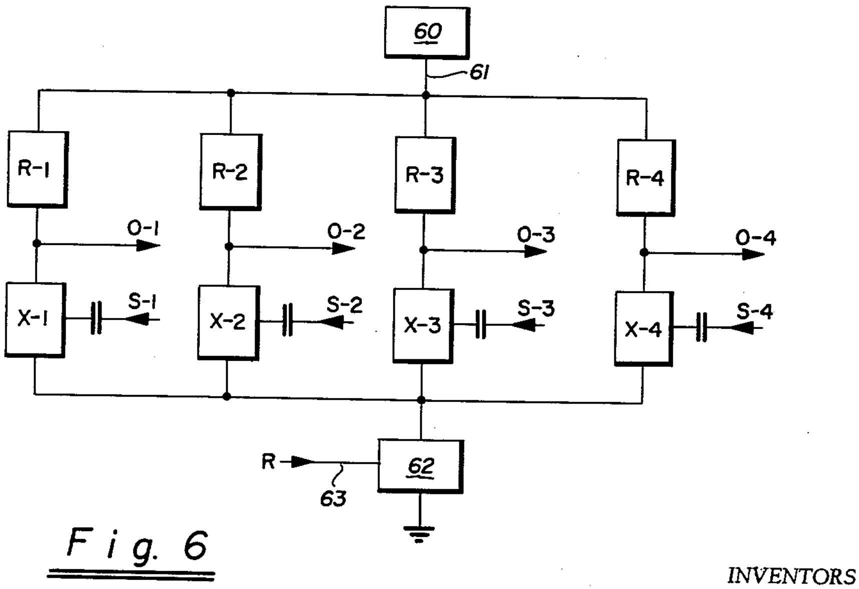

FIGS. 5*a* and 5*b* are schematic circuit diagrams of further embodiments of the R-S flip-flop of this invention which utilize three-terminal PNPN diodes; and FIG. 6 is a schematic circuit diagram of a binary buffer register which utilizes a plurality of the R-S flip-flops in accordance with this invention and which may be operated with a single current valve.

Briefly, the present invention accomplishes a number of its objects by utilizing an all silicon four-layer PNPN semiconductor (henceforth referred to as a PNPN diode) in a current conducting path connecting a single current valve, such as a transistor, tube or relay, to a voltage supply furnishing the load current. The PNPN diode operates as a current switching means and permits a large load current to flow therethrough in one direction when in its conductive state, and provides the desired output signal from a load impedance connected between the PNPN diode and the voltage supply. Upon application of a "set" pulse to the PNPN diode, it breaks down and becomes conductive and remains in the conductive state until the load current falls below a minimum value. The PNPN diode reverts to its non-conductive state upon the application of a "reset" pulse to the current valve which diminishes the load current to a value below the minimum value necessary to sustain the PNPN diode in its conductive state. Even a short "reset" pulse which interrupts the load current momentarily is sufficient to change the PNPN diode to its non-conductive state until a further "set" pulse is applied.

Figure 1:
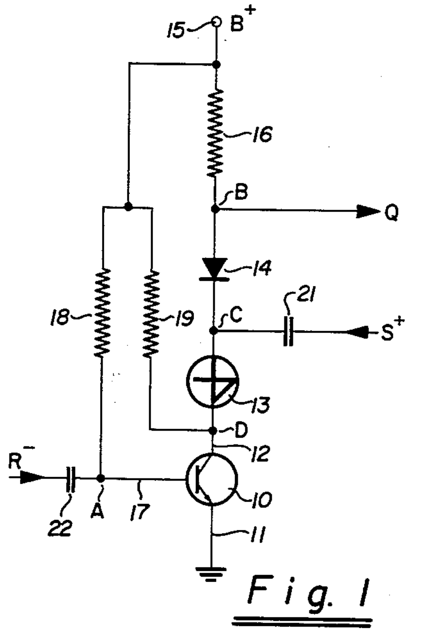
FIG. 1 is a schematic circuit diagram of an exemplary embodiment of the R-S flip-flop of this invention which utilizes a two-terminal PNPN diode.

Referring now to the drawings, and particularly to FIG. 1 thereof, an electronic valve, such as transistor 10, has one of its main electrodes, such as emitter 11, connected to a reference potential such as ground. The other main electrode, such as collector electrode 12, is connected to the N-zone of a two-terminal PNPN diode 13 whose P-zone is cascaded with the N-zone of a conventional PN diode 14. For convenience, the terminals connected to the P-zones and N-zones of PNPN diode 13 will also be referred to as the anode and cathode of PNPN diode 13 as is common practive in the description of PN diodes. Accordingly, the cathode of PN diode 14 is connected to the anode of PNPN diode 13, permitting current flow when PNPN diode 13 is in its conductive state and isolating output terminal point B from a "set" pulse applied to terminal point C.

The anode of PN diode 14 is connected to a suitable $B^+$ voltage supply, generally indicated by terminal 15, through a load impedance 16. The control electrode of electronic valve 10, such as base electrode 17, has impressed thereon a suitable potential to provide a base current sufficiently large to keep transistor 10 fully saturated. In the exemplary embodiment of FIG. 1, base electrode 17 is shown connected to the $B^+$ supply voltage 15 through a resistive biasing impedance 18. A resistive impedance 19 may be connected between $B^+$ supply voltage 15 and collector electrode 12 to permit a minimum current flow through transistor 10 when PNPN diode 13 is in its non-conductive state as will be explained in greater detail below.

Even though transistor 10 has been selected as being exemplary of a suitable current value, it is to be understood that an electronic tube (thermionic or photo) or an electromechanical relay may be used in practicing the invention, each having certain characteristics making it particularly useful for certain applications. For example, if the valve is required to control a very large amount of current, such as in buffer register applications having a large plurality of stages, a relay has been found to be most suitable. If speed of operation is a prime consideration, either thermionic tubes or transistors are selected because of their great speed. Also, transistors are preferred as current valves where small supply voltages are available and where small size and low temperatures are desired.

The R-S flip-flop of this invention provides an output signal generally designated by the reference character Q, from an output line connected to terminal point B. The "set" and "reset" pulses, designated by reference characters "S" and "R," may be applied to input lines connected to terminal junction points C and A respectively. It has been found desirable, but not necessary, to provide each of the input lines with an isolation capacitor, such as capacitors 21 and 22, so as to effectively isolate the circuit of this invention from the pulse actuating circuits. Additionally, such isolation capacitors aid in providing sharp pulses for the "S" and "R" activating signals.

Diode 13 is a silicon four-layer switching diode of the PNPN type and is provided with two end terminals, one being connected to its anode and the other to its cathode. Devices such as diode 13 are commonly referred to as two-terminal PNPN diodes, and are fully described in an article entitled "The Four-Layer Diode" by W. Shockley in the August 1957 issue of Electronic Industries and Tele-Tech. Briefly, it operates in either of two states: an open or high-impedance state of 1 to 100 megohms and a closed or low-impedance state of less than 9 ohms. The PNPN diode is switched from one state to the other by voltage and current applied to the device. As the voltage is raised in the forward direction, the PNPN diode reaches a breakdown voltage and changes to the low-impedance, highly conductive condition, thereby "closing the circuit" between the two terminals. The circuit remains "closed" as long as the required holding current is maintained. If the current falls below this value, the device resumes its open or high-impedance condition. The turn-on time of a PNPN diode is usually less than 0.1 microsecond. A more detailed explanation of the PNPN diode may be found in Patent No. 2,855,524 issued October 7, 1958, to Shockley on a Semiconductor Switch.

Figure 2:
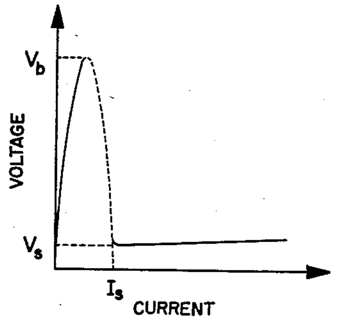
FIG. 2 is a graph showing the voltage-current characteristic of a two-terminal, four-layer PNPN diode utilized in connection with the circuit of FIG. 1.

In FIG. 2 there is plotted the voltage appearing across the terminals of PNPN diode 13 against the magnitude of current flowing therethrough from junction C to junction D, FIG. 1. As increasing voltage is applied to PNPN diode 13 beginning from zero, low current flows during the high-impedance condition of PNPN diode 13 until the breakdown voltage $V_b$ is reached. There then follows an unstable negative resistance region (indicated by a dotted line portion) in the voltage-current characteristic. Next, there follows a region in which, although the current flow is appreciable, only a small voltage appears across PNPN diode 13. This is the low-impedance state of the diode. In this region, the major portion of the voltage applied (that is the $B^+$ voltage) is developed across cascaded load impedance 16. After breakdown has been initiated, the breakdown condition will be sustained if there is maintained across PNPN diode 13 sufficient voltage $V_s$ to insure the flow of a sustaining current $I_s$. If the voltage applied is lowered beyond this value, $V_s$, PNPN diode 13 returns to its state of high-impedance and remains in such state until the breakdown initiating voltage $V_b$ is again reached.

Upon application of $B^+$ voltage to terminal 15, junction points B and C both rise immediately to the $B^+$ potential since initially PNPN diode 13 is in its high impedance state. At the same time, a biasing current starts flowing through biasing impedance 18, which supplies sufficient base current to base electrode 17 to fully saturate transistor 10 so that its collector to emitter electrode impedance is a minimum. As a consequence thereof, junction point D is raised to a value just above the reference potential to which emitter electrode 11 is connected, differing therefrom by the voltage drop across transistor 10 initiated by current flow through resistor 19. In the absence of optional resistor 19, the potential at junction point D would be substantially the same as that of emitter electrode 11. The voltage across PNPN diode 13 is therefore very nearly equal to the $B^+$ potential, differing therefrom by the voltage drop across transistor 10. Since it is desired to maintain PNPN diode 13 in its high impedance state until application of a "set" pulse, the magnitude of $B^+$ voltage supply potential is carefully selected to be below $V_b$, the breakdown potential of the PNPN diode. The steady state condition of the voltages at the various junction points after the application of $B^+$ voltage to terminal 15 are shown in FIG. 3 by the portion of the various identified curves lying to the left of a time line designated by reference character $t_1$.

Figure 3:
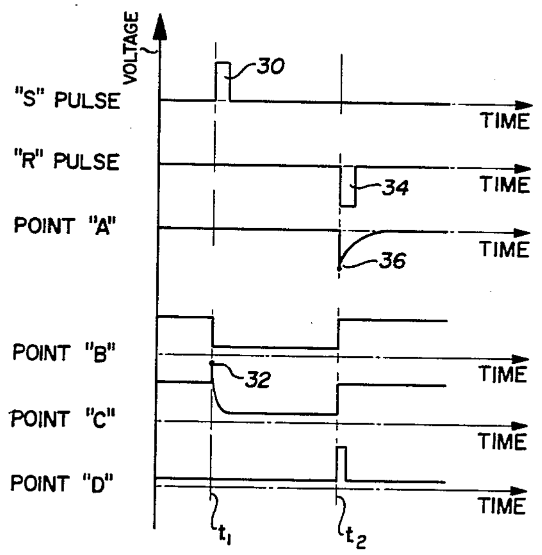
FIG. 3 is a chart showing the variations with time of the voltages at various identified points in the circuit of FIG. 1.

Upon application of a positive "set" pulse 30, FIG. 3, at time $t_1$ through optional isolation capacitor 21 to junction point C, junction C rises momentarily to a potential equal to $B^+$ potential plus the voltage of pulse 30 as indicated by point 32, FIG. 3. The magnitude of pulse 30 is carefully selected to raise junction point C to a potential greater than $V_b$, the PNPN diode breakdown voltage, so that PNPN diode 13 "breaks down" and assumes its high-conductance state. In the absence of back biased PN diode 14 (back biased with respect to the positive "set" pulse) the "set" pulse would have to be supplied by a very high current source to develop the necessary breakdown potential $V_b$ across resistor 16 which is usually or preferably a low impedance, that is less than 600 ohms. With diode 14 in the circuit, junction C is effectively isolated, facilitating the establishment of the necessary breakdown potential $V_b$. As soon as PNPN diode 13 becomes conductive, a large load current flows through load resistor 16, diode 14, PNPN diode 13 and transistor 10, resulting in a dropping of the potential of junction point B to which the output line is connected and output signal Q is derived. The potential of junction point C is also lowered and differs from the potential of junction point B only by the small voltage drop across diode 14. The steady state condition of the voltages at the various junction points after the application of a "set" pulse is shown in FIG. 3 by the portions of the various identified curves lying between time lines $t_1$ and $t_2$.

Upon application of a negative "reset" pulse 34, FIG. 3, at time $t_2$ through optional isolation capacitor 22 to junction A, junction A momentarily drops to a potential below the reference potential to which emitter electrode 11 is connected as indicated by point 36, FIG. 3. This drop of potential causes base current in base electrode 17 to drop to zero which, in turn, cuts off transistor 10 as shown by the momentary rise of potential of junction D. Of course, as soon as transistor 10 is cut off, load current through load impedance 16 diminishes rapidly and PNPN diode 13 changes to its high impedance state as soon as the load current drops below $I_s$, the sustaining current as explained in connection with FIG. 2. Once PNPN diode 13 is cut off, it remains in its high-impedance state until the further application of a "set" pulse. The steady state condition of the voltages at the various junction points after the application of a "reset" pulse is shown in FIG. 3 by the portion of the various identified curves lying to the right of time line $t_2$.

It has been found advantageous to permit current flow through transistor 10 when PNPN diode 13 is in its non-conductive state to permit faster circuit action upon the application of a "set" pulse to junction C. Resistive impedance 19, connected in the circuit as shown in FIG. 1, provides a constant collector current and thereby keeps transistor 10 in readiness for the load current initiated upon breakdown of diode 13 and caused by the application of a set pulse to junction C.

It appears appropriate at this time to note that the prime purpose of PN diode 14 is to facilitate the raising of the potential across PNPN diode 13 by means of a "set" pulse to a value sufficient to cause PNPN diode 13 to change to its high-conductance state. As previously indicated, diode 14 may be eliminated, if so desired, if a circuit means providing sufficient current is available to develop the required potential across load resistor 16. As will be explained in more detail below, the combination of two-terminal PNPN diode 13 and isolation diode 14 may be replaced with a three-terminal PNPN diode where the "set" pulse is applied to the control terminal of such a three-terminal PNPN diode. Utilization of a three-terminal PNPN diode makes it possible to "set" the circuit with a "set" pulse of less than one volt and further simplifies the circuit of this invention by making the isolation diode obsolete.

The following table sets forth circuit and component values which have been found to be perfectly satisfactory for the operation of the circuit of FIG. 1. The values are intended to be exemplary only and are not to be interpreted in a limiting sense.

| | |
|---|---|
| Transistor 10 | General Electric 2N167. |
| PN diode 14 | Hughes 1N191. |
| PNPN diode 13 | Beckman/Helipot 4N30D. |
| Resistor 16 | 560 ohms. |
| Resistor 18 | 22 kilohms. |
| Resistor 19 | 12 kilohms. |
| B+ potential | +28 volts. |
| S trigger pulse | +6 volts. |
| R trigger pulse | −6 volts. |
| Q output pulse | 28 volts off, 3.6 volts on. |

Figure 4:
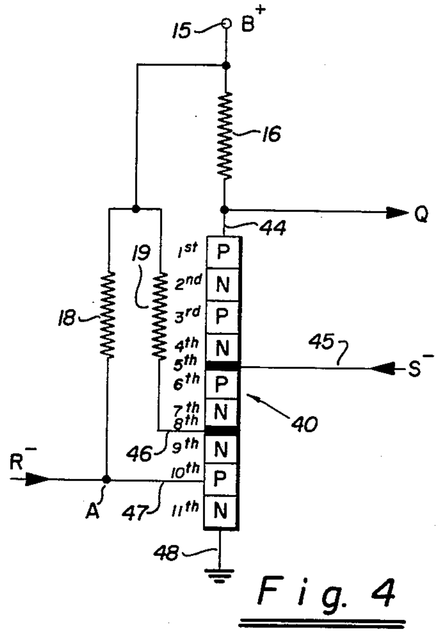
FIG. 4 is a schematic circuit diagram of an alternate embodiment of the circuit of FIG. 1, modified to operate with "set" and "reset" pulses of the same polarity and, further, showing the utilization of a compounded semiconductor device useful in providing an electronic package of minimum size.

The exemplary set-reset flip-flop shown in FIG. 1 requires, for its operation, positive "set" pulses and negative "reset" pulses and utilizes an NPN transistor and a positive potential power supply referenced to the emitter electrode to provide a low Q output signal in the "set" state and a high Q output signal in the "reset" state. As will be obvious to those skilled in the art, the circuit of FIG. 1 may be modified for operation with negative "set" and negative "reset" pulses by merely exchanging the respective positions of PNPN diode 13 and PN diode 14. FIG. 4 shows this modification and further shows the utilization of a compounded semiconductor device replacing PNPN diode 13, PN diode 14 and transistor 10, and providing a circuit arranged for minimum packaging. A similar compounded semiconductor device, in which the four-layer and the two-layer portions are exchanged, may be substituted for the three semiconductor devices 10, 13 and 14 shown in the circuit of FIG. 1. It will also be obvious to those skilled in the art that the circuit of FIG. 1 and FIG. 4 may also be modified to provide a high Q output signal (substantially equal to zero) in the "set" state and a low Q output signal (negative) in the "reset" state by replacing the NPN transistor 10 with a PNP transistor, reversing the anode and cathode leads of the PN diode and the PNPN diode, and substituting a negative power supply for the positive power supply. When so modified the R-S flip-flop of this invention may be operated with a positive "reset" pulse and either a positive or a negative "set" pulse, depending on whether the PNPN diode or the PN diode is directly connected to the PNP transistor.

Referring now to FIG. 4, there is shown a new and novel semiconductor device 40 comprising 11 zones or layers in succession, namely a P-zone, N-zone, P-zone, N-zone, conductive-zone, P-zone, N-zone, conductive zone, N-zone, P-zone and N-zone. Semiconductor device 40 includes five terminal electrodes coupled thereto as follows: terminal electrode 44 to the first zone, terminal electrode 45 to the first conductive-zone (fifth zone), terminal electrode 46 to the second conductive-zone (eighth zone), terminal electrode 47 to the tenth zone and terminal electrode 48 to the eleventh zone. By comparing conductive device 40 with the three semiconductor devices 10, 13 and 14 of FIG. 1, it is immediately apparent that the first four zones correspond to a two-terminal PNPN diode; the sixth and seventh zones correspond to a PN diode; the ninth, tenth and eleventh zones correspond to an NPN transistor; the first and second conductive zones correspond to junction points C and D respectively; electrodes 47 and 48 correspond to base electrode 17 and emitter electrode 11 respectively; and electrode 44 corresponds to junction B.

Arrangement and function of resistive impedances 16, 18 and 19 is similar in the circuits of FIGS. 1 and 4 so that the operation of the circuit of FIG. 4 will be apparent from the previous explanation of FIG. 1 and further description is believed to be unnecessary. Resistor 16 provides the load impedance, resistor 18 provides the base biasing impedance and resistor 19 provides the collector current. One difference worth noting is that the circuit of FIG. 4 shows an arrangement equivalent to FIG. 1 after exchanging PN diode 14 and PNPN diode 13 so that junction C will follow junction D rather than junction B. As a consequence thereof, the circuit may be "set" by the application of a negative pulse which lowers junction C (electrode 45) below the reference potential (electrode 48) by a value equal to the applied "set" pulse.

Semiconductor devices similar to device 40 may be used with the circuit of FIG. 1 and with the circuit modifications suggested above utilizing a B− supply to provide substantially zero Q output signals when the circuit is in the "set" state and negative Q output signals when the circuit is in the "reset" state. For example, a semiconductor device suitable for the circuit of FIG. 1 has the following configuration: P-zone, N-zone, conductive-zone, P-zone, N-zone, P-zone, N-zone, conductive-zone, N-zone, P-zone, N-zone. For a circuit utilizing a negative potential, a positive "reset" pulse, and a positive "set" pulse, a suitable semiconductor device has the following configuration: N-zone, P-zone, N-zone, P-zone, conductive-zone, N-zone, P-zone, conductive-zone, P-zone, N-zone, P-zone. If the last mentioned semiconductor device is changed to N-zone, P-zone, conductive-zone, N-zone, P-zone, N-zone, P-zone, conductive-zone, P-zone, N-zone, P-zone it may be used with negative "set" pulses. An eleven-zone semiconductor device, such as shown in FIG. 4, can be manufactured to have physical dimensions of less than ¼ inch in length and less than ⅛ inch in diameter. Obviously, a set-reset trigger circuit built in accordance with the teaching of the specification including an eleven-layer semiconductor device and three impedances, has tremendous advantages over conventional circuits in that it makes possible a degree of miniaturization heretofore though unobtainable. Furthermore, reliability and ruggedness are greatly increased and the number of components greatly reduced.

The circuit of FIG. 1 or FIG. 4 may be further simplified by utilizing a three-terminal four-layer PNPN diode as mentioned herebefore and which is marketed by Solid State Products, Inc. under the name of "Silicon PNPN Controlled Switch." In addition to the two terminals found on the Beckman/Helipot PNPN diode, the three-terminal PNPN diode is provided with an additional terminal connected to one of the intermediately located P or N zones and designated as the "gate" terminal electrode. The operation of the three-terminal PNPN diode is similar to that of the two-terminal PNPN diode in that it breaks down upon the application of a potential exceeding $V_b$, the breakdown potential, and reverts to its non-conductive state when the current therethrough falls below $I_s$, the sustaining current, as shown by the curve of FIG. 2. In addition to initiating the low-impedance state by applying a potential across the PNPN diode exceeding $V_b$, the three-terminal PNPN diode may be made conductive by applying a small negative trigger pulse to the "gate" electrode when the same is connected to the N-zone or by applying a small positive trigger pulse to the "gate" electrode when the same is connected to the P-zone. In other words, the three-terminal PNPN diode may be triggered either by application of a breakdown potential across the end terminals or the application of a trigger pulse to the "gate" terminal. The main advantage in utilizing the three-terminal PNPN diode is that a trigger pulse of less than ½ volt is sufficient to cause the desired breakdown and initiation of the conductive state and that a blocking or isolation diode, such as diode 14, FIG. 1, becomes entirely obsolete and may be dispensed with in constructing the R-S flip-flop of this invention. A further advantage is that a circuit incorporating a three-terminal PNPN diode does not require the application of a voltage anywhere near $V_b$ across the end terminals; all that it requires is a potential greater than $V_s$ to provide the necessary sustaining current to keep the PNPN diode in its conductive state.

Referring now to FIGS. *5a* and *5b*, there are shown two further embodiments of the set-reset flip-flop of this invention wherein the "set" pulse may be directly applied to a semiconductive zone of a semiconductor device. FIG. *5a* shows a flip-flop utilizing an eight-layer semiconductor device whose first four zones correspond in operation to a three-terminal PNPN diode and whose last three zones correspond in operation to a transistor current valve. FIG. *5b* shows a flip-flop utilizing a three-terminal PNPN diode cascaded to a transistor. In both flip-flops, a voltage source 55 impresses its potential upon the first zone of semiconductor device 50 or 56 respectively through a load impedance 16, which source is referenced to the last zone of semiconductor device 50 or current valve 57 respectively. Because the circuit may be "set" with a "set" pulse applied to a semi-conductive zone, the potential applied to load impedance 16 may, if so desired, be of less magnitude than the potential required for operating the circuits shown in FIGS. 1 and 4. As long as the magnitude of the source applied to terminal 55 is sufficient to cause a current to flow, which current is in excess of $I_s$, the sustaining current, the circuit of FIGS. *5a* and *5b* will operate satisfactorily. Further, the "set" pulse may be as small, and perhaps smaller, than one-half of a volt, depending upon the characteristics of the first four zones as indicated in the brief discussion on three-terminal PNPN diodes.

In FIG. *5a*, an eight-layer semiconductor device 50 includes four semiconductive layers 51 arranged to operate as a PNPN diode and three semiconductive layers 53 arranged to operate as a transistor. The four-layer portion 51 is connected to the three-layer portion 53 by a conductive layer 52. Such a semiconductor device 50 may be written in shorthand notation as a PNPNCNPN device where the C stands for conductive material layer. The terminal electrode 56 is connected to a $B^+$ supply 55 through load impedance 16 and the terminal electrode 57 is referenced to a reference potential such as ground. Biasing impedance 18 connects source 55 to an electrode coupled to conductive zone 52. The "set" input line is connected to the "gate" electrode 54 which is shown as being coupled to a P-zone. Consequently, the first four-layers 51 may be made conductive by application of a small positive trigger pulse to "gate" electrode 54. If desired, "gate" electrode 54 may be connected to the N-zone of the first four layers so that a negative trigger pulse may be used to "set" the circuits. It will be obvious to those skilled in the art that the circuit of FIG. *5a* may be modified in accordance with the suggestion made in connection with FIGS. 1 and 4 to operate with a $B^-$ supply voltage by substituting an NPNPCPNP semiconductor device for device 50.

Similarly, FIG. *5b* shows an R-S flip-flop in which a three-terminal PNPN diode 56 is cascaded with a PNP transistor 57. PNPN diode 56 has impressed upon its anode a $B^-$ potential connected thereto through load impedance 16. Base biasing impedance 18 connects the $B^-$ potential to the base of transistor 57. Optional collector current impedance 19 provides collector current at all times. Application of a negative "set" pulse to "gate" electrode 54 will put the circuit into the "set" state. Just as indicated above, "gate" electrode 54 may also be connected to the P-zone of PNPN diode 56 so that a positive "set" pulse may be used to operate the circuit. Also, PNP transistor 57 may be replaced with an NPN transistor if the polarity of the $B^-$ supply voltage and the anode and cathode of PNPN diode 56 are reversed.

The operation of the circuits shown in FIGS. *5a* and *5b* will be apparent from the previous explanation of FIG. 1 so that no further explanation is believed necessary. From FIGS. *5a* and *5b* it is readily apparent that a flip-flop constructed in accordance therewith requires either a semiconductor device such as an eight-layer semiconductor or a single electronic valve serially connected to a three-terminal PNPN diode in addition to impedances 16 and 18. (Resistor 19 is optional and is only required if the set-reset device is to operate very fast.) It is obvious that a set-reset trigger requiring so few components advances the art greatly and provides a circuit of improved reliability and minimum physical size. Additionally, the output impedance is very low, making available greater power than conventional set-reset trigger pulses to drive other equipment such as relays or output circuits.

In certain applications, a plurality of set-reset flip-flop circuits may be combined to form, as for example, a buffer register in which all flip-flops may be reset by a common "reset" pulse and may be individually set by "set" pulses. Use of conventional set-reset flip-flops to form such a combination requires a great number of components without any savings being made possible by component sharing. Combining set-reset flip-flops constructed in accordance with this invention, on the other hand, permits sharing the current valve, thereby providing a greatly simplified structure.

Referring now to FIG. 6, a plurality of semiconductor devices, of which four are shown and designated respectively by X–1, X–2, X–3 and X–4, are each provided with three terminals. Each of the semiconductor devices, which may be simply referred to by the reference character X, may comprise either a conventional PN diode serially connected to a two-terminal PNPN diode as shown and described in connection with FIGS. 1 and 4, or a three-terminal PNPN diode as described in connection with FIG. 5. One terminal of each of semiconductor devices X, which may be either the anode or the cathode depending upon the polarity of the supply voltage, is connected to a source 60 via individual load impedances R–1, R–2, R–3 and R–4. The other terminal of each semiconductor device X, which is either the cathode or the anode, is connected to a current valve 62 which may comprise either a transistor, an electronic tube or a relay.

A judicious choice of a particular current valve depends, at least to some extent, on the number of stages included in the buffer register. Each stage contributes its share to the total current flow through electronic valve 62 and, consequently, care must be taken to select a valve which can handle such current flow. For example, for a many stage buffer register a relay may be found best suited because of its superior current carrying capacity. In other applications, where the number of stages is small so that the total current flowing is within the current carrying capacity of transistors, a transistor may be selected. In any case, current valve 62 is provided with a control input line 63 to which a "reset" pulse may be applied to effectively open the valve 62, thereby diminishing the current through all devices X so that the latter revert to their high-impedance states in accordance with the description of device X given hereinbefore.

The third terminal electrode of the individual semiconductor device X, which is the "gate" electrode of the three-terminal PNPN diode or the input line coupled to junction C connecting a PN diode to a two-terminal PNPN diode, may be utilized as the "set" input line to which the "set" pulses are applied. The individual load impedances R–1, R–2, R–3 and R–4 may comprise filament lamps so that a visual indication of the state of each flip-flop may be obtained. Output lines O–1, O–2, O–3 and O–4, connected respectively to the junctions between devices X and impedances R may be utilized to obtain a permanent indication of each state of the register by connecting the individual output lines to a suitable utilization device such as a tape or drum memory unit.

It will be obvious to those skilled in the art and from the foregoing description that the circuits of the R-S flip-flop and, of course, the buffer register of this invention may be arranged for operation with any combination of positive or negative "set" or "reset" pulses to provide either "high" or "low" output signals.

There has been described a set-reset flip-flop which may comprise silicon type semiconductor devices to achieve greatly increased temperature stability. Further, the output impedance of the circuit of FIG. 1 is greatly reduced over that of conventional set-reset trigger devices by connecting a small load impedance directly to a reference potential through a semiconductor device. Also, the number of components required for constructing an R-S flip-flop in accordance with this invention is greatly decreased compared with conventional flip-flops. Only two impedances and one or more semiconductor devices are required, depending on the particular embodiment selected.

Although there has been described an invention with a certain degree of particularity, it is understood that the present disclosure has been made only by way of example and that numerous changes in the details of construction and combination and arrangement of parts may be resorted to without departing from the spirit and the scope of the invention as hereafter claimed.

What is claimed is:

1. A set-reset flip-flop comprising: a four-zone semiconductor device having a stable high-impedance state and a quasi-stable high-conductance state and which changes from its quasi-stable to its stable state when the current therethrough drops below a minimum value; circuit means coupled to said four-zone semiconductor for applying a voltage pulse thereto of sufficient magnitude to initiate said quasi-stable state; a load impedance; a source of voltage having its output terminals connected to said four-zone semiconductor device through said load impedance; and an electric current valve coupling said four-zone semiconductor device to a reference voltage, said valve being normally conductive and including circuit means for applying a voltage pulse making said valve momentarily non-conductive and thereby causing the current through said four-zone semiconductor device to fall below said minimum value.

2. A set-reset flip-flop comprising: a semiconductor device including at least a P-zone, N-zone, P-zone and N-zone in succession and adapted to assume a stable high-impedance state and a quasi-stable unidirectional high-conductance state, said semiconductor device changing to its quasi-stable state upon the application of a "set" pulse and changing to its stable state when the current therethrough drops below a characteristic minimum value; first circuit input means coupled to said semiconductor for applying said "set" pulse to initiate said quasi-stable state; a load impedance coupled to one terminal of said semiconductor device; a normally conductive electric current valve coupled to the other terminal of said semiconductor device, said valve being responsive to a "reset" pulse and being operative to become substantially non-conductive upon the application of said "reset" pulse; a source of voltage coupled between said load impedance and said valve; and second circuit input means coupled to said valve for applying said "reset" pulse whereby said valve becomes substantially non-conductive and thereby drops the current flowing through said semiconductor device below said characteristic minimum value and changes said semiconductor device to its stable state.

3. A set-reset flip-flop comprising: a semiconductor device including at least a P-zone, N-zone, P-zone and N-zone in succession and having first and second current terminals and a control terminal, said semiconductor device having a stable high-impedance state and a quasi-stable unidirectional low-impedance state, said quasi-stable low-impedance state being initiated by a "set" pulse applied to said control terminal and being maintained by said semiconductor device until current flowing therethrough drops below a characteristic minimum value; first circuit input means coupled to said control terminal for applying said "set" pulse to initiate said quasi-stable state; a load impedance; a transistor having base, emitter and collector electrodes, said collector electrode being coupled to said first current terminal; a source of voltage referenced to said emitter electrode coupled to said second current terminal through said load impedance; biasing circuit means coupled to said base electrode for providing sufficient base current to said transistor to permit current flow through said semiconductor device of a magnitude above said characteristic minimum value; and second circuit input means for applying a "reset" pulse of sufficient magnitude to said base electrode to cause said transistor to cut off and thereby diminish the current flowing through said semiconductor device to a magnitude below said characteristic minimum value.

4. Apparatus in accordance with claim 3 wherein said semiconductor device comprises a two-terminal PNPN diode serially coupled to a PN diode and wherein said control electrode is coupled between said PNPN diode and said PN diode.

5. Apparatus in accordance with claim 3 wherein said semiconductor device comprises a three-terminal PNPN diode and wherein said three terminals correspond to said first current, second current and control terminals.

6. Apparatus in accordance with claim 3 wherein said biasing circuit comprises a biasing impedance coupling said base electrode to said source of voltage.

7. Apparatus in accordance with claim 3 wherein said semiconductor device comprises seven zones in succession including six semiconductive-zones and one conductive-zone for defining four rectifier junctions and wherein said control terminal is being connected to said conductive-zone.

8. Apparatus in accordance with claim 3 wherein a further impedance couples said source of voltage to said collector electrode, said further impedance having a magnitude substantially larger than said load impedance.

9. A set-reset flip-flop comprising: a transistor having base, collector and emitter electrodes; a two-terminal PNPN diode having a quasi-stable high-conductance state; a unidirectional current conducting means serially coupled to said PNPN diode and defining therewith a semiconductor circuit element having first and second terminal electrodes, said first terminal electrode being connected to said collector electrode; means for applying a first control signal to the junction between said PNPN diode and said unidirectional current conducting means to initiate the high-conductance state of said PNPN diode upon the occurrence of said first control signal; a load impedance; a source of voltage referenced to said emitter electrode having its output terminal connected to said second terminal electrode through said load impedance; and circuit means coupled to said base electrode to provide sufficient base current to saturate said transistor, said circuit means also including means responsive to a second control signal to reduce said base current to a value sufficient to cut off collector current upon the occurrence of said second control signal.

10. A set-reset flip-flop comprising: a transistor having base, collector and emitter electrodes; a three-terminal PNPN diode having first and second terminal electrodes and a control electrode, said first terminal electrode being connected to said collector electrode; means for applying a first control signal to said control electrode; a load impedance; a source of voltage referenced to said emitter electrode having its output terminal connected to said second terminal electrode through said load impedance; and circuit means coupled to said base electrode to provide sufficient base current to saturate said transistor, said circuit means also including means responsive to a second control signal to reduce said base current to a value sufficient to cut off collector current upon the occurrence of said second control signal.

11. A set-reset flip-flop circuit for providing substantially "zero" voltage output signals from a circuit output terminal in response to positive "set" pulses applied to a first circuit input terminal and for providing positive output signals from said circuit output terminal in response to negative "reset" pulses applied to a second circuit terminal, said flip-flop comprising: a two-terminal PNPN dicde having an anode and a cathode; a PN diode having an anode and a cathode, the cathode of said PN diode and the anode of said PNPN diode being connected to said first circuit input terminal and the anode of said PN diode being connected to said circuit output terminal; an NPN transistor having base, collector and emitter electrodes, said collector electrode being coupled to the cathode of said PNPN diode and said base electrode being coupled to said second circuit input terminal; a resistive load impedance; a positive source of voltage referenced to said emitter electrode having its output terminal connected to said circuit output terminal through said resistive load impedance; and a resistive base biasing impedance connecting said second circuit input terminal to said source of voltage.

12. A set-reset flip-flop circuit for providing substantially "zero" voltage output signals from a circuit output terminal in response to negative "set" pulses applied to a first circuit input terminal and for providing negative output signals from said circuit output terminal in response to positive "reset" pulses applied to a second circuit input terminal, said flip-flop comprising: a two-terminal PNPN diode having an anode and a cathode; a PN diode having an anode and a cathode, the anode of said PN diode and the cathode of said PNPN diode being connected to said first circuit input terminal and the cathode of said PN diode being connected to said circuit output terminal; a PNP transistor having base, collector and emitter electrodes, said collector electrode being coupled to the anode of said PNPN diode and said base electrode being coupled to said second circuit input terminal; a resistive load impedance; a negative source of voltage referenced to said emitter electrode having its output terminal connected to said circuit output terminal through said resistive load impedance; and a resistive base biasing impedance connecting said second circuit input terminal to said source of voltage.

13. A set-reset flip-flop circuit for providing substantially "zero" voltage output signals from a circuit output terminal in response to negative "set" pulses applied to a first circuit input terminal and for providing positive output signals from said circuit output terminal in response to negative "reset" pulses applied to a second circuit input terminal, said flip-flop comprising: a two-terminal PNPN diode having an anode and a cathode; a PN diode having an anode and a cathode, the anode of said PN diode and the cathode of said PNPN diode being connected to said first circuit input terminal and the anode of said PNPN diode being connected to said circuit output terminal; an NPN transistor having base, collector and emitter electrodes, said collector electrode being coupled to the cathode of said PN diode and said base electrode being coupled to said second circuit input terminal; a resistive load impedance; a positive source of voltage referenced to said emitter electrode having its output terminal connected to said circuit output terminal through said resistive load impedance; and a resistive base biasing impedance connecting said second circuit input terminal to said source of voltage.

14. A set-reset flip-flop circuit for providing substantially "zero" voltage output signals from a circuit output terminal in response to positive "set" pulses applied to a first circuit input terminal and for providing negative output signals from said circuit output terminal in response to positive "reset" pulses applied to a second circuit input terminal, said flip-flop comprising: a two-terminal PNPN diode having an anode and a cathode; a PN diode having an anode and a cathode, the cathode of said PN diode and the anode of said PNPN diode being connected to said first circuit input terminal and the cathode of said PNPN diode being connected to said circuit output terminal; a PNP transistor having base, collector and emitter electrodes, said collector electrode being coupled to the anode of said PN diode and said base electrode being coupled to said second circuit input terminal; a resistive load impedance; a negative source of voltage referenced to said emitter electrode having its output terminal connected to said circuit output terminal through said resistive load impedance; and a resistive base biasing impedance connecting said second circuit input terminal to said source of voltage.

15. A register circuit comprising: a plurality of semiconductor devices, each semiconductor device including at least a P-zone, N-zone, P-zone and N-zone in succession and having first and second current terminals and a control terminal, said semiconductor device having a stable high-impedance state and a quasi-stable unidirectional high-conductance state, said quasi-stable state being initiated by a "set" pulse applied to said control terminal and being maintained by said semiconductor device until current flowing between said first and second current terminals drops below a characteristic minimum value; a first circuit input means coupled to the control terminal of each semiconductor device for applying the "set" pulses to initiate its quasi-stable state; a load impedance coupled to the first current terminal of each of said semiconductor devices; a normally conductive electric current valve, the second current terminals of each of said semiconductor devices being coupled to said valve, said valve being responsive to a "reset" pulse and being operative to become substantially non-conductive upon the application of said "reset" pulse; a source of voltage for applying an operating potential to said plurality of load impedances; and second circuit input means coupled to said valve for applying said "reset" pulse whereby said valve becomes substantially non-conductive and thereby drops the current flowing through each of said semiconductor devices below said characteristic minimum value to change each of said semiconductor devices to its stable state.

16. A flip-flop circuit comprising: a semiconductive body having eleven zones in succession and including nine semiconductor zones and two conductive-zones for defining six rectifying junctions, said semiconductive body having terminal electrodes connected to the first, tenth, and eleventh zones and at least to the first of said two conductive-zones; a load impedance; a source of voltage referenced to the terminal electrode connected to said eleventh zone having its output terminal coupled to the electrode connected to said first zone through said load impedance; a biasing impedance for coupling the electrode connected to said tenth zone to said source of voltage; first circuit input means for applying an operating "reset" pulse to the electrodes connected to said tenth zone; and second circuit input means for applying an operating "set" pulse to the electrode connected to said first conductive-zone.

17. A set-reset flip-flop circuit comprising a four-zone diode and a three-zone transistor, said transistor and said diode being stacked together into a single body with a conductive layer connecting therebetween, input means coupled to the four layer diode for passing a voltage pulse to render the four layer diode conductive, and further input means coupled to the transistor for passing a reset signal to render the transistor and the four layer diode non-conductive.

18. A set-reset flip-flop circuit comprising a four-zone diode, a two-zone diode, and a three-zone transistor, said diodes and said transistor being stacked together into a single body with conductive layers connecting therebetween, input means coupled to the conductive layer between the diodes for passing a voltage pulse to render the four layer diode conductive, and further input means coupled to the transistor for passing a re-set signal to render the transistor and the four layer diode non-conductive.

References Cited in the file of this patent

UNITED STATES PATENTS

| | | |
|---|---|---|
| 2,581,273 | Miller | Jan. 1, 1952 |
| 2,627,039 | MacWilliams | Jan. 27, 1953 |
| 2,655,610 | Ebers | Oct. 13, 1953 |
| 2,838,617 | Tummers | June 10, 1958 |
| 2,890,353 | Van Overbeek | June 9, 1959 |
| 2,967,952 | Shockley | Jan. 10, 1961 |

FOREIGN PATENTS

| | | |
|---|---|---|
| 166,800 | Australia | Feb. 6, 1956 |

OTHER REFERENCES

"New Solid State Devices and Applications" by Samuel Weber, Electronics, April 17, 1959, pages 39–41.